United States Patent [19]
Hug

[11] Patent Number: 4,561,584
[45] Date of Patent: Dec. 31, 1985

[54] INTEGRATED CIRCUIT PACKAGE REMOVAL

[75] Inventor: Paul Hug, Santa Clara County, Calif.

[73] Assignee: Storage Technology Partners, Louisville, Colo.

[21] Appl. No.: 542,828

[22] Filed: Oct. 17, 1983

[51] Int. Cl.[4] ............................ B23K 1/00; B23K 3/02
[52] U.S. Cl. ........................................ 228/19; 228/119; 228/264
[58] Field of Search ..................... 228/19, 20, 51, 119, 228/191, 264

[56] References Cited

U.S. PATENT DOCUMENTS

| | | | |
|---|---|---|---|
| 3,735,911 | 5/1973 | Ward | 228/191 X |
| 3,834,605 | 9/1974 | Coffin | 228/20 |
| 3,879,836 | 4/1975 | Coffin | 228/264 |
| 4,022,370 | 5/1977 | Durney | 228/191 |
| 4,441,647 | 4/1984 | Holmes | 228/119 |

FOREIGN PATENT DOCUMENTS 2925347 1/1981 Fed. Rep. of Germany ...... 228/264

Primary Examiner—Kenneth J. Ramsey
Assistant Examiner—M. Jordan
Attorney, Agent, or Firm—Bryant R. Gold; James R. Young

[57] ABSTRACT

An apparatus for removing lap soldered circuit packages from the module to which they are soldered is presented. The module is placed over the apparatus with the circuit package on the underneath side. A nozzle of the apparatus is raised so as to be centered below the circuit package, and a heated gas is directed over the lap soldered leads for a predetermined time. When the solder melts, gravity causes the circuit package to fall away from the module. The falling package is caught and held by the nozzle. The nozzle is then lowered away from the module, and as it is lowered, push rods protrude upwardly through the nozzle to support the circuit package and lift it out of the nozzle, thereby positioning the nozzle for easy and safe handling.

8 Claims, 5 Drawing Figures

INTEGRATED CIRCUIT PACKAGE REMOVAL

BACKGROUND OF THE INVENTION

This invention relates to a tool for removing circuit packages from the module to which they are soldered. More particularly, it relates to a tool which removes lap soldered integrated circuit packages from the module to which they are soldered without causing damage to the leads of the circuit package or to the module.

Circuit packages, such as integrated circuit packages, are typically mounted on a module, such as a printed circuit board, which module provides desired electrical interconnections between the circuit packages. There are a variety of techniques used to mount the circuit package on the module, e.g.: putting the leads of the package into through-plated-holes on the module and soldering them in place; soldering a socket in through-plated-holes on the module and installing the circuit package in the socket; lap soldering outwardly protruding leads of the circuit package to solder plated pads provided on the module, etc.

As the number of leads on a circuit package becomes large, the leads usually become smaller, more densely arranged on the package, and more fragile. In general, when the number of leads becomes large, it is preferred that the circuit package be lap soldered to the module. When a circuit package is lap soldered to the module, methods must be developed to unsolder and remove it from the module. Since both the module and the circuit package may be quite expensive, the removal method should not cause damage to either.

One technique known in the prior art for removing circuit packages from a module to which the leads of the circuit package have been lap soldered is a simple manual method which uses a soldering iron and "solder wick" (solder wick is a braided copper material which absorbs molten solder). An operator places the end of a piece of solder wick on a lead and presses it against the lead with the tip of the hot soldering iron. When the solder melts, the wick absorbs it, thereby removing the melted solder from the lead and module. This must be done to each lead of the package. The major disadvantage of this method is that it is totally manual and the length of time that the soldering iron is applied may vary. If the soldering iron is held too long, the pad under the lead may lift from the printed circuit board. If the soldering iron is not held long enough, all of the solder may not be removed, meaning that the lead may not be totally unsoldered from the pad.

Another technique known in the prior art for removing circuit packages from a printed circuit board to which the leads of the package have been lap soldered is a tool which directs a stream of hot gas, whose temperature is high enough to melt the solder, against the soldered leads. The end of the tool may be a special nozzle which forms the stream of hot gas such that it strikes the module only in the area of the lap soldered pins. Included as part of the tool is some mechanism for physically grasping the circuit package and removing it from the module once the hot gas has melted the solder. This is typically realized with a tool that grips the package and, through an appropriate spring or clutch mechanism, applies a force to the package in such a manner as to pull or lift it away from the module once the solder has melted. Unfortunately, this type of mechanism may pull unevenly and bend or break the leads. Further, if all but a few leads have had their solder bond melted, this type of mechanism exerts sufficient force to pull the package away from the module, thereby pulling pads off of the module where the few leads are still attached. In addition, the mechanism that grips the package may slip off of the package while it is attempting to pull, twist, turn, etc., the package. This "slipping" may not only damage the package and/or the module, but it also requires that additional time be spent in realigning the tool so that the package can be finally removed. Moreover, any tool which physically moves the circuit package when unsoldered also requires that sufficient room be made available for the tool and the movement. This means that the nozzle supplying the hot gas must be farther away from the module, complicating the problems of temperature control of the gas striking the leads and of directing the hot gas to the desired locations where the leads are soldered to the board.

It is thus apparent that a need exists in the art for an improved method of removing lap soldered circuit packages from the module to which they are soldered.

SUMMARY OF THE INVENTION

An objective of the present invention is to provide an apparatus and method for efficiently removing lap soldered circuit packages from the module to which they are soldered without causing damage to either the circuit package or the module.

The apparatus of the present invention comprises a fixture adapted to hold the module upon which the circuit packages are soldered in a substantially horizontal position, with the circuit package to be removed being on the lower or underneath side of the module. Included as part of the fixture is a raisable column or duct that is constructed to function as a plenum. A nozzle end of the plenum may be selectively positioned beneath the circuit package to be removed. A compressed, heated gas is controllably directed through the plenum and its nozzle to the soldered leads of the package, causing the solder to melt. When the solder melts, the force of gravity allows the package to fall away from the module and to be safely caught or held in the nozzle end of the plenum. The plenum is then lowered, and the undamaged circuit package may be readily lifted away from the nozzle end thereof.

The plenum advantageously includes means for controllably introducing a pressurized gas therein, as well as means for selectively heating the gas to a desired temperature. These control features, coupled with the ability to position the nozzle at a specified distance from the solder leads of the circuit package, allow the desoldering process of the circuit package leads to occur without damage to either the circuit package or the module. No external forces, other than the force of gravity, need be used to pull the circuit package away from the module. The force of gravity (a constant for purposes of this invention) pulls the circuit package away from the module with a gentle constant force that is less than that required to pull pads, bend leads, or otherwise damage either the packages or the module. Thus, only when all the leads are desoldered will the circuit package fall away from the module. The nozzle of the plenum uniformly directs the hot pressurized gas to the point where the leads are soldered to the module, thereby causing all of the leads to become desoldered at approximately the same time, at which time the circuit package falls away from the module and the flow of pressurized gas through the plenum can be shut off.

The method of the present invention includes positioning the module to which the circuit package is soldered so that the package is on the underneath or lower side thereof, uniformly heating the leads of the package at the point where they are soldered to the module, and catching the package as it falls away from the module under the force of gravity.

BRIEF DESCRIPTION OF THE DRAWINGS

The above and other objects, features, and advantages, of the present invention will become more apparent from the following more particular description thereof presented in conjunction with the following drawings, wherein.

DESCRIPTION OF THE PREFERRED EMBODIMENT

The following is a description of the best presently contemplated mode of carrying out the present invention. This description is given only to illustrate the general principles of the invention and is not to be taken in a limiting sense. To ascertain the true scope of the invention, reference should be made to the appended claims.

Figure 1:
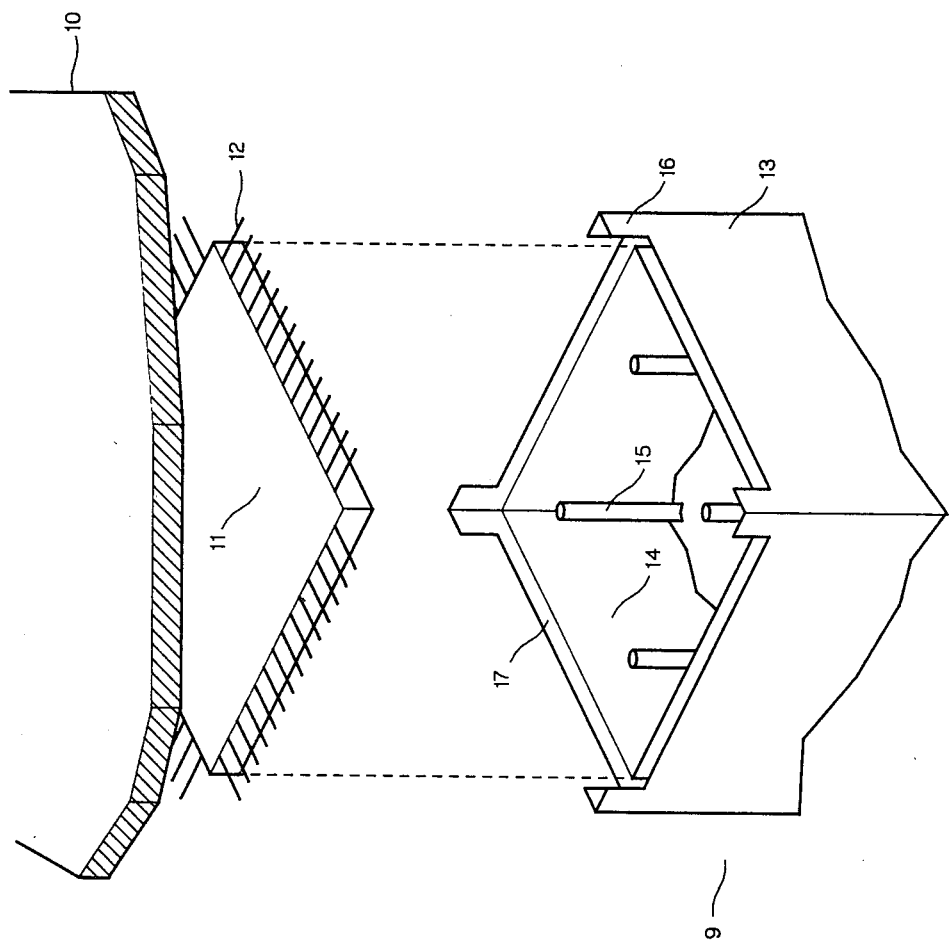
FIG. 1 is an exploded cutaway perspective view showing the relationship of a nozzle of the invention to a circuit package to be removed from a module.

FIG. 1 is a cutaway exploded perspective drawing showing the relationship of a circuit package 11 to a nozzle 9. The circuit package 11 has a multiplicity of leads 12, which leads have previously been lap soldered to a module 10, e.g., a printed circuit board or a multilayer ceramic carrier. According to the present invention, the module 10 is mounted in a suitable fixture 38 (FIG. 2) with the circuit package 11 being positioned on the underneath or lower side of the module. Conventional means are provided for aligning the circuit package 11 directly over the nozzle 9.

The nozzle 9 is fabricated from a suitable material, such as metal, and has the same approximate cross sectional shape as the circuit package 11. A channel 17 is formed in the nozzle 9 between an outer peripheral wall 13 and an inner peripheral wall 14. This channel extends around the entire circumference or perimeter of the nozzle 9. The cross section of the nozzle 9 defined by the outer wall 13 (the outer perimeter of the nozzle) is made larger than the circuit package 11, but smaller than the area encompassed by the leads 12 of the circuit package 11. The inner wall 14 of the nozzle 9 is lower than the corners of the outer wall 13, and the cross section of the nozzle 9 defined by this inner wall is slightly smaller in size than the body of the circuit package 11. Thus, when the circuit package 11 falls away from the module 10 (as explained later), the circuit package 11 is held within the nozzle 9 and is supported by the body of the circuit package resting on the edge of the inner wall 14 or the leads 12 resting on the edge of the outer wall 13.

The outer wall has a raised portion 16 at each corner with a recessed portion in between. When the nozzle 9 is elevated (as explained later), these raised portions 16 contact the module 10, but do not touch the leads 12. Also shown in FIG. 1 are a plurality of rods 15 located inside of the inner wall 14. The function of these rods is discussed below.

Figure 2:
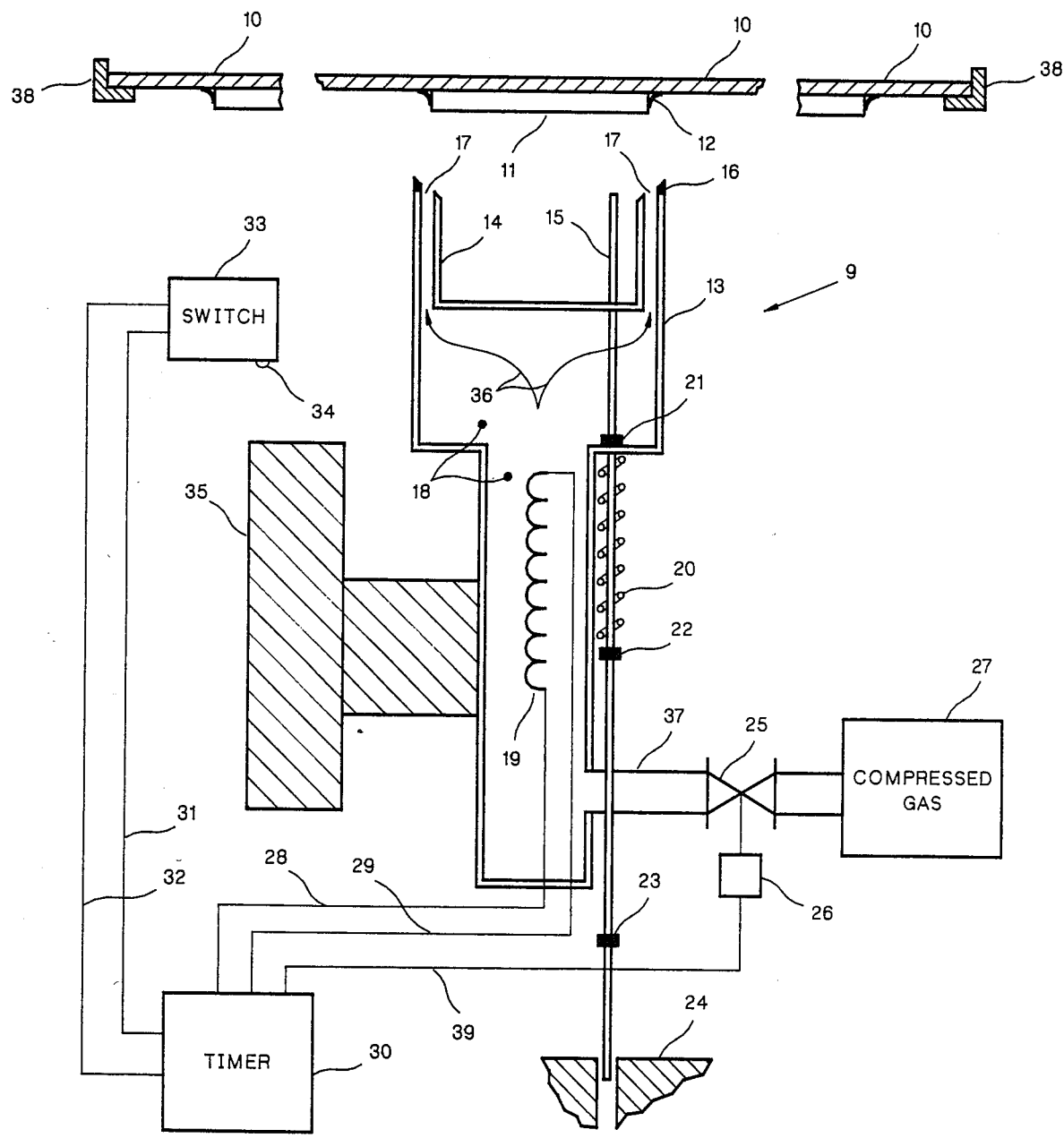
FIG. 2 is a schematic diagram showing the principal elements of one embodiment of the invention.

FIG. 2 is a schematic diagram showing the principal elements of one embodiment of the invention. The nozzle 9 is an integral part of a plenum 18. Within the plenum 18 is a heating element 19 which is connected to a timer 30 by the wires 28-29. The plenum 18 is connected to a source of compressed gas 27 by a hose 37. The hose 37 has an electrically controlled valve 25 inserted therein. A solenoid 26 opens and closes the valve 25 in response to a signal received from the timer 30 over a signal line 39.

An elevating mechanism 35 is attached to the wall of the plenum 18. The elevating mechanism 35 raises the plenum 18 and associated parts until the nozzle 9 encloses the circuit package 11 from the underneath side thereof. The elevating mechanism 35 also lowers the nozzle after the package is removed. The elevating mechanism 35 may be of any suitable conventional design, such as a mechanism driven by hand, by an electric motor, pneumatically, etc.

One of the plurality of rods 15 is shown in FIG. 2 with three stops 21, 22, and 23 attached. A top stop 21 keeps the rod 15 from going any lower than shown in the figure. A coil spring 20 (shown in cross-sectional form), through which the rod 15 passes, pushes against a middle stop 22, thereby keeping the rod 15 in the position shown in the figure when the elevating mechanism 35 has been raised. A lower stop 23 engages a base structure 24 when the elevating mechanism 35 is lowered, stopping the downward motion of the rod 15. Thus, as the elevating mechanism 35, and the nozzle 9 are lowered, the downward motion of the rod 15 is stopped as soon as the stop 23 hits the base structure 24, thereby causing the rod 15 to protrude above the level of the nozzle 9. This action advantageously lifts the circuit package 9 up away from the nozzle so that it can be easily removed, as shown best in FIG. 3c.

The operation of the invention can now be explained. The module 10 is placed in the fixture 38 with the circuit package 11 on the underside, positioned over the nozzle 9. The elevating mechanism 35 then raises the nozzle 9, plenum 18 and other associated components until the raised portion 16 of the outer wall 13 of the nozzle touches the module 10. When this occurs, the elevating mechanism 35 depresses a button 34 of a switch 33.

The closure of switch 33, as sensed through the wires 31-32, starts the timer 30. The timer 30 turns on the heater 19, via the conductors 28-29, and opens the valve 25, via the signal line 39 and solenoid 26, for a predetermined time. (As thus described, it is thus apparent that the timer 30 comprises a plurality of switches that switch power to the elements described at the appropriate times. The source of power for these elements, not shown in the figure, may be any conventional power source, such as an ac power line, a battery, etc.) Compressed gas from a suitable source 27 flows through the valve 25, the hose 37, and into the plenum 18. The gas is heated by the heater 19, develops a uniform temperature in the upper part of the plenum chamber 18, and flows, as indicated by the arrows 36, up the channel 17.

The heated gas flows over the lap soldered leads 12 of the circuit package 11 and melts the solder that bonds the leads to the module 10. An important feature of the invention is that no externally generated force need be applied to the circuit package 11 to remove it from the module 10. When the solder on all the leads melts, the package 11, because of gravity, gently falls into the nozzle 9.

The timer 30 is adjusted such that it is on only slightly longer than the time necessary to remove the circuit package 11. When the timer 30 turns off, it turns off the heater 19 and removes the voltage from the solenoid 26, causing the valve 25 to close. Thus, hot gas is not applied to the surface of the module 10 any longer than necessary, thereby preventing damage to the module 10.

After the timer 30 is turned off, the elevating mechanism is lowered. When the lower stop 23 touches the base 24, the downward motion of the rods 15 is stopped. As the elevating mechanism continues to be lowered, the spring 20 compresses, and the circuit package 11 is pushed up away from the nozzle 9 by the stationary rods 15.

Figure 3A:
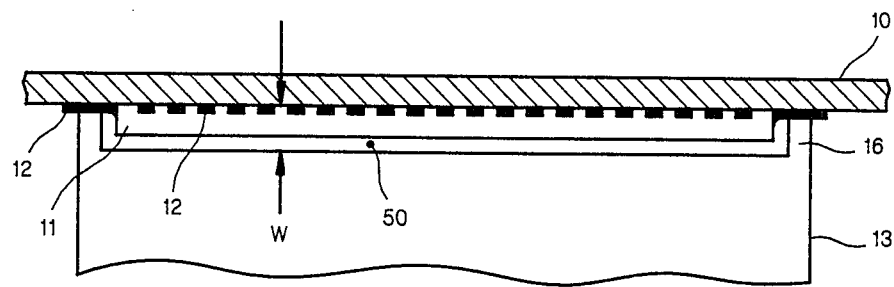
FIG. 3a is a side view showing the nozzle of the invention raised and positioned under the circuit package prior to removing it from the module.
Figure 3B:
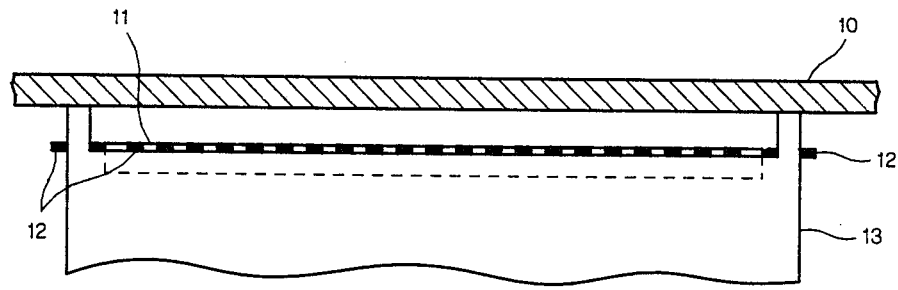
FIG. 3b is a similar side view showing the nozzle of the invention raised, after the circuit package has fallen away from the module.
Figure 3C:
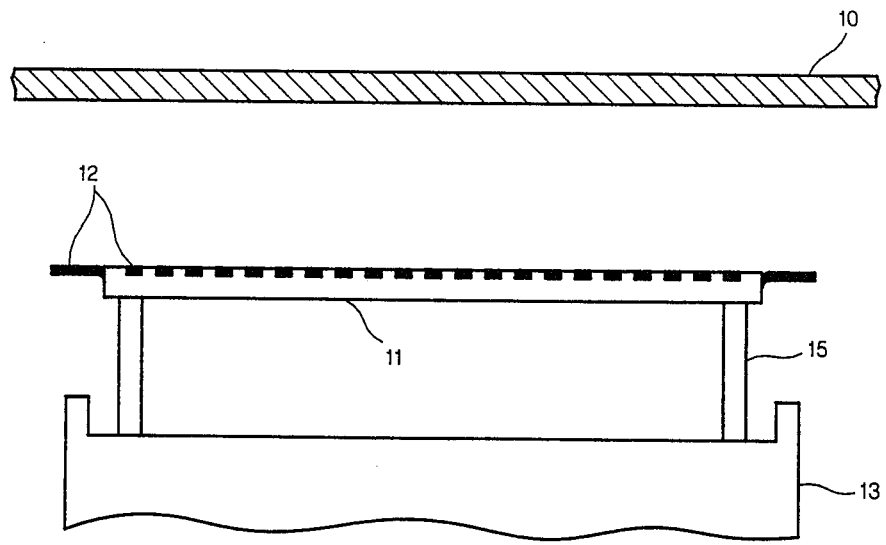
FIG. 3c is likewise a side view showing the nozzle of the invention lowered with the circuit package being held in a raised position from the lowered nozzle so as to facilitate the subsequent removal and handling thereof.

FIGS. 3a-3c are side views illustrating these principles of operation. (Reference may also be made to FIG. 2 during the following discussion.) FIG. 3a shows the nozzle 9 raised and the circuit package 11 still attached to the module 10 by the lap soldered leads 12. The raised portions 16 of the nozzle 9 are touching the module 10, forming a slot 50 of width W between the raised portions 16. The hot gas flows up the channel 17 and out the slot 50. The slot 50 directs the hot gas over the leads 12.

The thickness W of the slot 50 is an important dimension. If it is too large, not enough heat is transferred to the leads 12 to melt the solder. If it is too small, too much heat may be concentrated on the module 10 and damage it before the circuit package 11 drops off. A thickness W of 10-15 mils (0.010-0.015 inches) has proven most effective for removing lap soldered leads of LSI circuit packages containing 64-256 leads.

FIG. 3b shows the nozzle 9 still raised after the circuit package 11 has dropped off the module 10. It is supported in the nozzle 9 by the leads 12 which extend beyond all the sides of the outer wall 13.

FIG. 3c shows the nozzle 9 fully lowered. As explained previously, the rods 15 stop their downward motion when the lower stop 23 comes in contact with the base 24. As the nozzle 9 is lowered even more, the rods 15 thereby hold the circuit package 11 stationary, "lifting" it out of the downwardly moving nozzle. As illustrated in FIG. 3c, once the downward motion of the nozzle 9 carries the nozzle below the ends of the rods 15, the package 11 is available to be easily handled without subjecting the leads to the possibility of damage.

In summary, the present invention is an apparatus and method that quickly and efficiently removes a circuit package from a module without causing damage to either. Furthermore, once the removal process has been completed, the circuit package is positioned so as to be readily available for easy and safe handling.

Many changes and modifications in the above-described embodiment of the invention can of course be carried out without departing from the scope of the invention which is intended to be limited only by the scope of the appended claims.

What is claimed is:

1. An apparatus for removing circuit packages from a module to which a plurality protruding leads of the package are soldered comprising:
   a fixture for holding said module such that the circuit package to be removed from the module lies on a downward facing side of said module;
   a nozzle for directing a flow of heated gas and for catching said circuit package including:
      an outer peripheral wall, the area encompassed by said outer wall being larger than the area defined by the body of said circuit package without considering said leads, but smaller than the area defined by said circuit package including said leads,
      an inner peripheral wall spaced inwardly and apart from said outer peripheral wall, said hot pressurized gas being directed to flow between said outer and inner walls, the area encompassed by said inner wall being smaller than said circuit package,
      whereby said package and leads are caught and held by the upper edge of said outer or inner walls when said package falls away from said module; and
   means for controllably directing said flow of heated gas through said nozzle to the leads of said package, whereby the hot gas melts the solder holding the leads to the module.

2. The apparatus of claim 1 wherein said nozzle is selectively raisable to a point centered just below the circuit package to be removed from said module.

3. The apparatus of claim 2 further including spacing means for automatically spacing the nozzle at a prescribed distance below said module.

4. An apparatus for removing circuit packages from a module to which a plurality of outwardly protruding leads of the package are soldered comprising:
   a fixture for holding said module such that the circuit package to be removed from the module lies on a downward facing side of said module;
   a nozzle for directing a flow of heated gas and for catching said circuit package including:
      an outer peripheral wall, the area encompassed by said outer wall being larger than the area defined by the body of said circuit package without considering said leads, but smaller than the area defined by said circuit package including said leads,
      an inner peripheral wall spaced inwardly and apart from said outer peripheral wall, said hot pressurized gas being directed to flow between said outer and inner walls, the area encompassed by said inner wall being smaller than said circuit package,
      whereby said package and leads are caught and held by the upper edge of said outer or inner walls when said package falls away from said module;
   means for controllably directing said flow of heated gas through said nozzle to the leads of said package, whereby the hot gas melts the solder holding the leads to the module; and
   means for positioning the caught circuit in a position whereat it can be easily handled and maneuvered.

5. The apparatus of claim 1 wherein said nozzle is selectively raisable to a point centered just below the circuit package to be removed from said module.

6. The apparatus of claim 5 further including spacing means for automatically spacing the nozzle at a prescribed distance below said module.

7. The apparatus of claim 6 wherein the prescribed distance at which the nozzle is placed below said module lies within the range of 0.010 to 0.020 inches.

8. The apparatus of claim 5 wherein said means for positioning the caught circuit in a position whereat it can be easily handled and maneuvered comprises at least one push rod vertically positioned within the area encompassed by said inner peripheral wall, said push rod including stop means for preventing the downward motion of said rod beyond a prescribed position as the nozzle is lowered away from the module, an upper end of the stopped push rod thereby coming in contact with the body of the circuit package as the nozzle is further lowered, thereby effectively lifting the circuit package off of the nozzle so that the package may be easily handled and maneuvered.

* * * * *